(12) United States Patent
Kuo et al.

(10) Patent No.: US 11,641,713 B2
(45) Date of Patent: May 2, 2023

(54) CIRCUIT BOARD STRUCTURE AND MANUFACTURING METHOD THEREOF

(71) Applicant: Unimicron Technology Corp., Taoyuan (TW)

(72) Inventors: Chun-Hung Kuo, Taoyuan (TW); Kuo-Ching Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/483,824

(22) Filed: Sep. 24, 2021

(65) Prior Publication Data
US 2022/0322529 A1    Oct. 6, 2022

Related U.S. Application Data

(60) Provisional application No. 63/169,201, filed on Mar. 31, 2021.

(30) Foreign Application Priority Data

Aug. 20, 2021 (TW) ................................ 110130794

(51) Int. Cl.
*H05K 1/02* (2006.01)
*H05K 1/11* (2006.01)
(Continued)

(52) U.S. Cl.
CPC .......... *H05K 1/115* (2013.01); *H05K 1/0298* (2013.01); *H05K 1/09* (2013.01); *H05K 3/0094* (2013.01); *H05K 2201/0323* (2013.01)

(58) Field of Classification Search
CPC ........ H05K 1/115; H05K 1/0298; H05K 1/09; H05K 3/0094; H05K 2201/0323; H05K 1/112; H05K 1/113
See application file for complete search history.

(56) References Cited

U.S. PATENT DOCUMENTS

2010/0003462 A1* 1/2010 Kamins .................. C30B 25/02
    117/106
2019/0206586 A1* 7/2019 Guo ......................... H05K 3/02
(Continued)

FOREIGN PATENT DOCUMENTS

CN      111370388      7/2020
TW      201406229      2/2014

OTHER PUBLICATIONS

"Office Action of Taiwan Counterpart Application", dated Mar. 15, 2022, p. 1-p. 5.

*Primary Examiner* — Steven T Sawyer
(74) *Attorney, Agent, or Firm* — JCIPRNET

(57) ABSTRACT

A circuit board structure, including a circuit layer, a first dielectric layer, a first graphene layer, a first conductive via, and a first built-up circuit layer, is provided. The circuit layer includes multiple pads. The first dielectric layer is disposed on the circuit layer and has a first opening. The first opening exposes the pads. The first graphene layer is conformally disposed on the first dielectric layer and in the first opening, and has a first conductive seed layer region and a first non-conductive seed layer region. The first conductive via is disposed in the first opening. The first built-up circuit layer is disposed corresponding to the first conductive seed layer region. The first built-up circuit layer exposes the first non-conductive seed layer region and is electrically connected to the pads through the first conductive via and the first conductive seed layer region.

13 Claims, 10 Drawing Sheets

(51) Int. Cl.
*H05K 1/09* (2006.01)
*H05K 3/00* (2006.01)

(56) References Cited

U.S. PATENT DOCUMENTS

| | | | |
|---|---|---|---|
| 2019/0348344 A1* | 11/2019 | Lu | H01L 23/562 |
| 2020/0135655 A1* | 4/2020 | Yang | H01L 21/76802 |
| 2021/0082829 A1* | 3/2021 | Yang | H01L 21/76876 |

* cited by examiner

CIRCUIT BOARD STRUCTURE AND MANUFACTURING METHOD THEREOF

CROSS-REFERENCE TO RELATED APPLICATION

This application claims the priority benefit of U.S. Provisional Application No. 63/169,201, filed on Mar. 31, 2021 and Taiwan Application No. 110130794, filed on Aug. 20, 2021. The entirety of each of the patent applications is hereby incorporated by reference herein and made a part of this specification.

BACKGROUND

Technical Field

The disclosure relates to a circuit board structure and a manufacturing method thereof, and particularly relates to a circuit board structure using graphene as an etching-free seed layer and a manufacturing method thereof.

Description of Related Art

As the demand for 5G and fine circuitry increases, the design of heat dissipation and the demand for lineament specifications of lines are receiving more and more attention. During the current manufacturing process, after the circuit is formed, the seed layer in the space needs to be removed by an etching process to form independent circuits. However, during the etching process, the situation of circuit undercut, circuit peel-off, or circuit shape deformation often happens to the lineament of the circuit due to the attack of the etching solution, which is not conducive to signal transmission, affects the dependability of the product, or causes poor quality of the product.

SUMMARY

The disclosure provides a circuit board structure and a manufacturing method thereof, which can effectively improve the reliability of signal transmission or the yield of a product.

The circuit board structure of the disclosure includes a circuit layer, a first dielectric layer, a first graphene layer, a first conductive via, and a first build-up circuit layer. The circuit layer includes multiple pads. The first dielectric layer is disposed on the circuit layer and has a first opening. The first opening exposes the pads. The first graphene layer is conformally disposed on the first dielectric layer and in the first opening, and has a first conductive seed layer region and a first non-conductive seed layer region alternately disposed. The first conductive via is disposed in the first opening. The first build-up circuit layer is disposed corresponding to the first conductive seed layer region. The first build-up circuit layer exposes the first non-conductive seed layer region and is electrically connected to the pads through the first conductive via and the first conductive seed layer region.

In an embodiment of the disclosure, the circuit board structure further includes a second dielectric layer, a second graphene layer, a second conductive via, and a second build-up circuit layer. The second dielectric layer is disposed on the first build-up circuit layer and covers the first non-conductive seed layer region. The second dielectric layer has a second opening, and the second opening exposes the first build-up circuit layer. The second graphene layer is conformally disposed on the second dielectric layer and in the second opening, and has a second conductive seed layer region and a second non-conductive seed layer region. The second conductive via is disposed in the second opening. The second build-up circuit layer is disposed corresponding to the second conductive seed layer region. The second build-up circuit layer exposes the second non-conductive seed layer region and is electrically connected to the first build-up circuit layer through the second conductive via and the second conductive seed layer region.

In an embodiment of the disclosure, the circuit board structure further includes an oxidation graphene layer. The oxidation graphene layer is conformally disposed on the first build-up circuit layer. The second opening penetrates the oxidation graphene layer to expose a portion of a surface of the first build-up circuit layer.

In an embodiment of the disclosure, the circuit board structure further includes an insulating protective layer. The insulating protective layer is disposed on the second build-up circuit layer and exposes a pad of the second build-up circuit layer.

In an embodiment of the disclosure, the circuit board structure further includes an electronic element. The electronic element is embedded in the second dielectric layer and has an active surface and a back surface opposite to each other. The active surface of the electronic element is electrically connected to the first build-up circuit layer, and the back surface contacts the second graphene layer.

In an embodiment of the disclosure, the electronic element protrudes from an upper surface of the second dielectric layer. The electronic element further has a surrounding surface connecting the active surface and the back surface. The second graphene layer contacts a portion of the surrounding surface.

In an embodiment of the disclosure, the circuit board structure further includes a third dielectric layer, a third graphene layer, a third conductive via, and a third build-up circuit layer. The third dielectric layer is disposed on the second build-up circuit layer and covers the second non-conductive seed layer region. The third dielectric layer has a third opening, and the third opening exposes the second build-up circuit layer. The third graphene layer is conformally disposed on the third dielectric layer and in the third opening, and has a third conductive seed layer region and a third non-conductive seed layer region. The third conductive via is disposed in the third opening. The third build-up circuit layer is disposed corresponding to the third conductive seed layer region. The third build-up circuit layer exposes the third non-conductive seed layer region and is electrically connected to the second build-up circuit layer through the third conductive via and the third conductive seed layer region.

In an embodiment of the disclosure, the second dielectric layer further has a fourth opening, and the circuit board structure further includes an electronic element and a fourth conductive via. The electronic element is disposed on the first non-conductive seed layer region and has an active surface and a back surface opposite to each other. The fourth conductive via is disposed in the fourth opening. The second build-up circuit layer is electrically connected to the electronic element through the fourth conductive via and the second conductive seed layer region.

In an embodiment of the disclosure, the circuit board structure further includes an oxidation graphene layer. The oxidation graphene layer is conformally disposed on the electronic element, and the oxidation graphene layer is located between the electronic element and the second dielectric layer.

The manufacturing method of the circuit board structure of the disclosure includes the following steps. A circuit structure is provided. The circuit structure includes a circuit layer and a first dielectric layer. The first dielectric layer is disposed on the circuit layer. The circuit layer includes multiple pads. A first opening is formed in the first dielectric layer to expose the pads. A first graphene layer is conformally formed on the first dielectric layer and in the first opening. The first graphene layer has a first portion and a second portion. A first conductive via is formed in the first opening. A first build-up circuit layer is formed on the first portion to expose the second portion. The second portion of the first graphene layer is oxidized to form a first non-conductive seed layer region, and the first portion is defined as a first conductive seed layer region. The first build-up circuit layer is disposed corresponding to the first conductive seed layer region and is electrically connected to the pads through the first conductive via and the first conductive seed layer region.

In an embodiment of the disclosure, the manufacturing method further includes the following steps. A second dielectric layer is formed on the first build-up circuit layer to cover the first non-conductive seed layer region. The second dielectric layer has a second opening to expose the first build-up circuit layer. A second graphene layer is conformally formed on the second dielectric layer and in the second opening. The second graphene layer has a third portion and a fourth portion. A second conductive via is formed in the second opening. A second build-up circuit layer is formed on the third portion to expose the fourth portion. The fourth portion of the second graphene layer is oxidized to form a second non-conductive seed layer region, and the third portion is defined as a second conductive seed layer region. The second build-up circuit layer is disposed corresponding to the second conductive seed layer region and is electrically connected to the first build-up circuit layer through the second conductive via and the second conductive seed layer region.

In an embodiment of the disclosure, the manufacturing method further includes the following steps. An insulating protective layer is formed on the second build-up circuit layer to expose a pad of the second build-up circuit layer.

In an embodiment of the disclosure, before forming the second dielectric layer on the first build-up circuit layer, the manufacturing method further includes the following step. An electronic element is disposed on the first build-up circuit layer. The electronic element has an active surface and a back surface opposite to each other, the active surface is electrically connected to the first build-up circuit layer, and the back surface contacts the second graphene layer.

In an embodiment of the disclosure, the second dielectric layer further has a fourth opening, and before forming the second dielectric layer on the first build-up circuit layer, the manufacturing method further includes the following steps. An electronic element is disposed on the first non-conductive seed layer region. The electronic element has an active surface and a back surface opposite to each other, and a surrounding surface connecting the active surface and the back surface. The back surface faces the first non-conductive seed layer region. An oxidation graphene layer is conformally formed on the electronic element to cover the active surface and the surrounding surface. After forming the second dielectric layer on the first build-up circuit layer, the manufacturing method further includes the following step. A fourth conductive via is formed in the fourth opening, so that the second build-up circuit layer is electrically connected to the electronic element through the fourth conductive via and the second conductive seed layer region.

In an embodiment of the disclosure, before forming the second dielectric layer on the first build-up circuit layer, the manufacturing method further includes the following step. An oxidation graphene layer is conformally formed on the first build-up circuit layer to cover the first build-up circuit layer.

Based on the above, in the circuit board structure of the embodiments of the disclosure, since the first non-conductive seed layer region may have good insulation, no additional etching process is required to remove the first non-conductive seed layer region after forming the first build-up circuit layer. In this way, the conventional situation of circuit undercut, circuit peel-off, or circuit shape deformation can be prevented from happening to the seed layer covered by the first build-up circuit layer when removing the seed layer exposed by the first build-up circuit layer, and the reliability of signal transmission or the yield of the product can also be effectively improved.

In order for the features and advantages of the disclosure to be more comprehensible, the following specific embodiments are described in detail in conjunction with the accompanying drawings.

DETAILED DESCRIPTION OF DISCLOSED EMBODIMENTS

FIG. 1A to FIG. 1G are schematic cross-sectional views of a manufacturing method of a circuit board structure according to an embodiment of the disclosure. The manufacturing method of a circuit board structure 10a of the embodiment may include the following steps.

Figure 1A:
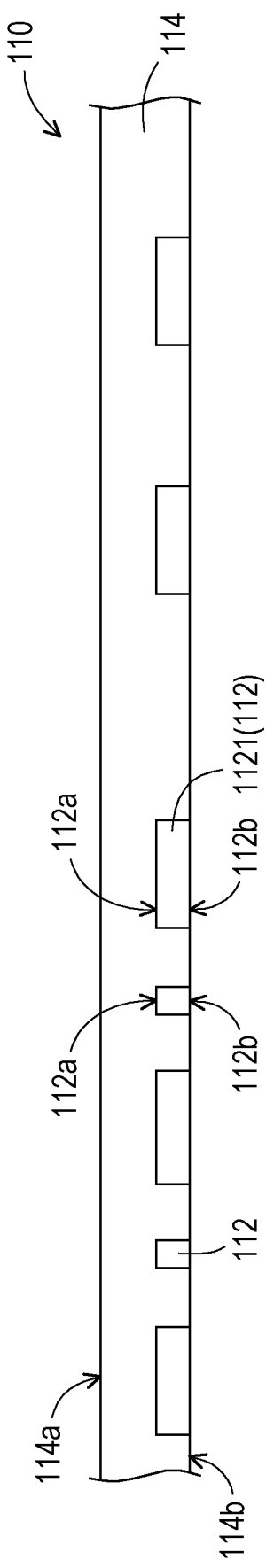
FIG. 1A to FIG. 1G are schematic cross-sectional views of a manufacturing method of a circuit board structure according to an embodiment of the disclosure.

Referring to FIG. 1A. In the embodiment, a circuit structure 110 is first provided. The circuit structure 110 includes a circuit layer 112 and a first dielectric layer 114. The first dielectric layer 114 is disposed on the circuit layer 112, and the circuit layer 112 includes multiple pads 1121. Specifically, the first dielectric layer 114 has an upper surface 114a and a lower surface 114b opposite to each other, and the circuit layer 112 has an upper surface 112a and a lower surface 112b opposite to each other. The circuit layer 112 is embedded in the first dielectric layer 114, and the first dielectric layer 114 exposes the lower surface 112b of the circuit layer 112. In other words, the lower surface 114b of the first dielectric layer 114 and the lower surface 112b of the circuit layer 112 are aligned and coplanar. In the embodiment, the material of the circuit layer 112 may be, for example, copper or other conductive materials, and the material of the first dielectric layer 114 may be, for example, resin or other dielectric materials, but not limited thereto. Here, the method for forming the circuit layer 112 may be, for example, a photolithography electroplating semi-additive process (SAP), a modified semi-additive process (mSAP), or a tenting process, but not limited thereto.

Figure 1B:
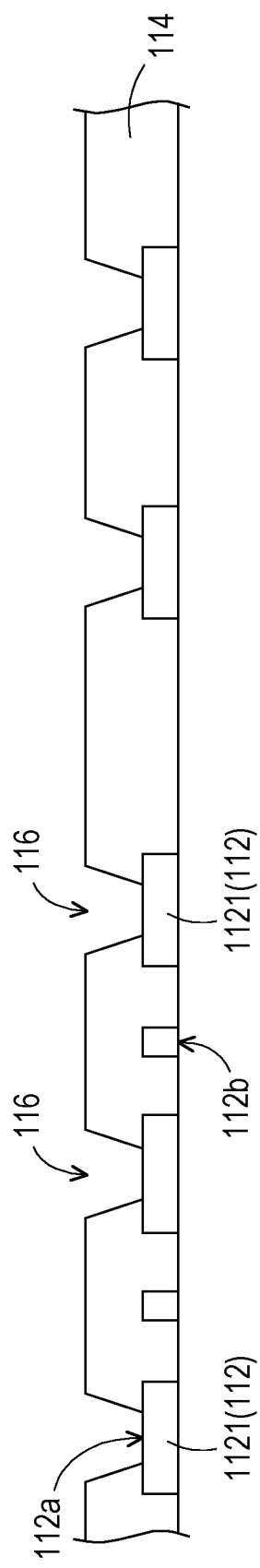

Next, please refer to FIG. 1B. A first opening 116 is formed in the first dielectric layer 114 to expose the pads 1121. In the embodiment, the first opening 116 may expose the upper surface 112a of a portion of the circuit layer 112 (for example, a corresponding pad 1121), but not limited thereto. Here, the method for forming the first opening 116 may be, for example, laser drilling, but not limited thereto.

Figure 1C:
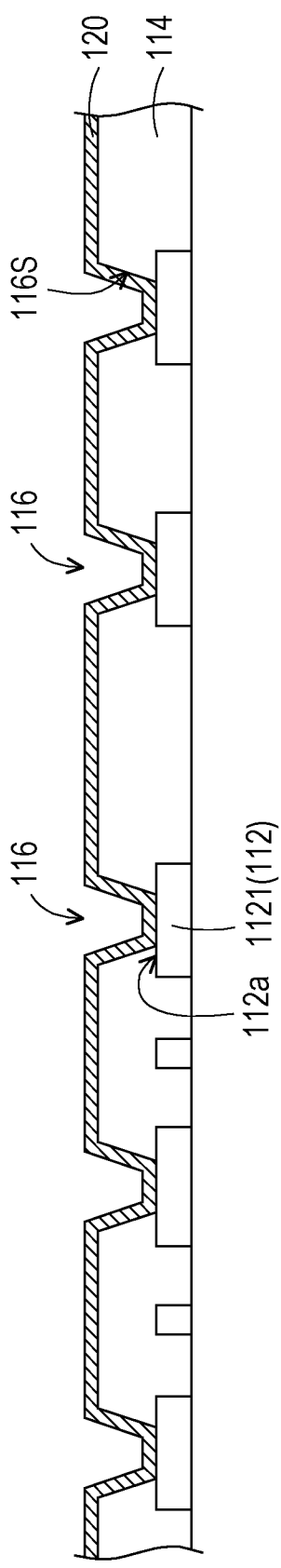

Next, please refer to FIG. 1C. A first graphene layer 120 is conformally formed on the first dielectric layer 114 and in the first opening 116. Specifically, the first graphene layer 120 directly contacts and completely covers the upper surface 114a of the first dielectric layer 114, a side wall 116S in the first opening 116, and the upper surface 112a of the portion of the circuit layer 112 exposed by the first opening 116 (for example, the pad 1121). In the embodiment, the first graphene layer 120 may be composed of a single-layer or multi-layer graphene film and has a substantially uniform thickness. The thickness of the first graphene layer 120 may be, for example, between 0.5 nm and 500 nm, but not limited thereto. When the thickness of the first graphene layer 120 is less than 0.5 nm, it will not be easy to use the first graphene layer 120 as a seed layer during a subsequent manufacturing process. When the thickness of the first graphene layer 120 is greater than 500 nm, it will be difficult to completely oxidize the first graphene layer 120 during a subsequent oxidation process.

In the embodiment, the method for forming the first graphene layer 120 may include the following steps. Firstly, a graphene solution is prepared. Next, graphene is uniformly deposited on the first dielectric layer 114 and in the first opening 116, wherein the deposition method may be, for example, a soaking method (the soaking time is, for example, 10 seconds to 5 minutes, but not limited thereto) or a coating method. Next, a drying step is executed, such as blow drying with hot air at 80° C., but not limited thereto. The graphene solution configured above may be a reduced graphene solution or an oxidized graphene solution. When the graphene solution configured above is the reduced graphene solution, the first graphene layer 120 at this stage is formed after the drying step. If the oxidized graphene solution is used for graphene deposition, a reduction process (for example, application of $H_2$ plasma, but not limited thereto) must be performed after executing the drying step to reduce oxidation graphene to reduced oxidation graphene, thereby forming the first graphene layer 120 at this stage. In addition, in the embodiment, since the liquid graphene solution may be uniformly coated on various uneven substrates, and a graphene material also has good adhesion to dielectric material, the graphene material may be used as a seed layer material.

Figure 1D:
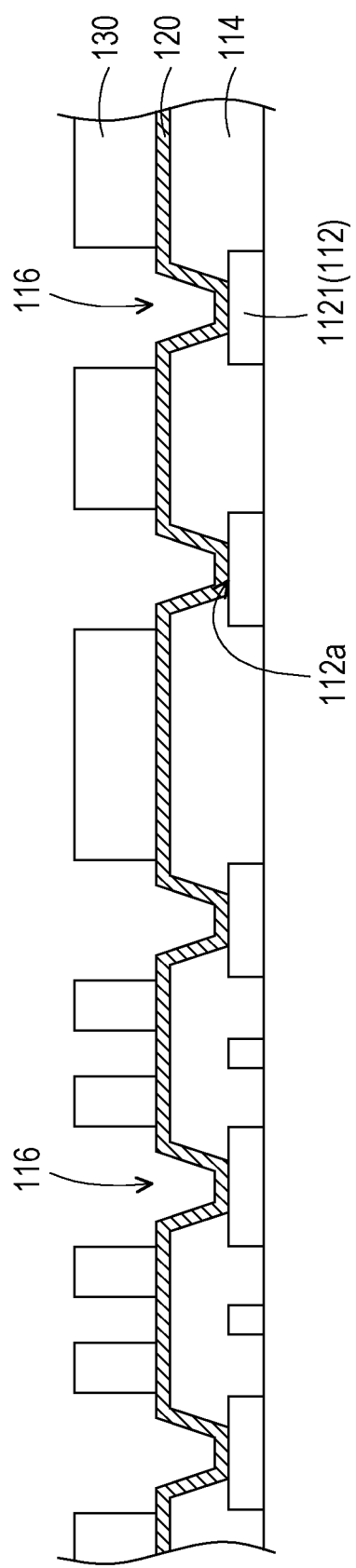
Figure 1E:
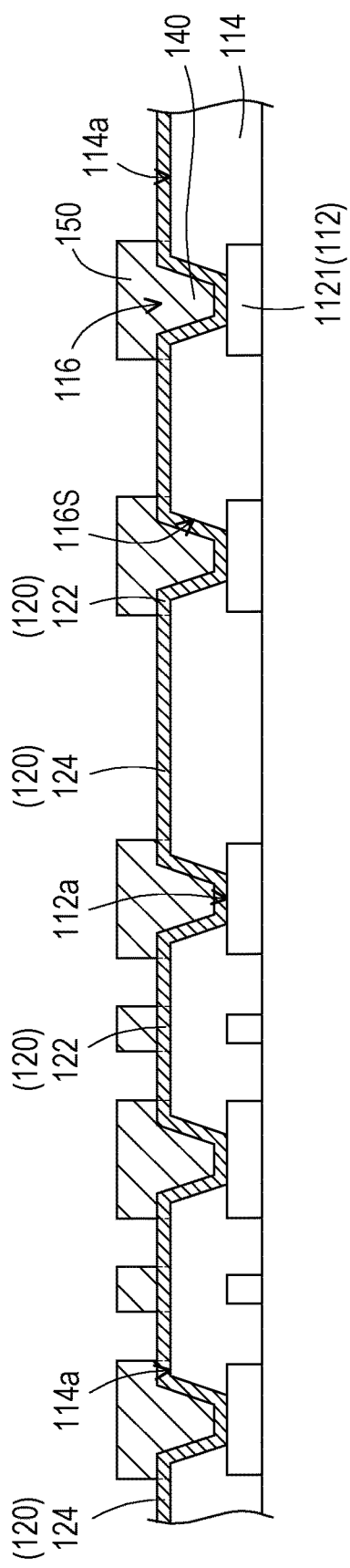

Next, please refer to FIG. 1D and FIG. 1E. A first conductive via 140 is formed in the first opening 116, and a first build-up circuit layer 150 is formed on a first portion 122 of the first graphene layer 120 to expose a second portion 124 of the first graphene layer 120. Specifically, in the embodiment, the method for forming the first conductive via 140 and the first build-up circuit layer 150 may include the following steps. Firstly, as shown in FIG. 1D, a patterned photoresist layer 130 is formed on the first graphene layer 120 to expose a portion of the first graphene layer 120. Next, as shown in FIG. 1E, the first graphene layer 120 is used as the seed layer to form the first conductive via 140 and the first build-up circuit layer 150 on a portion of the first graphene layer 120, and the patterned photoresist layer 130 is removed to expose another portion of the first graphene layer 120. Here, the material of the patterned photoresist layer 130 may be, for example, a positive photoresist or a negative photoresist, but not limited thereto.

In the embodiment, a portion of the first graphene layer 120 covered by the first build-up circuit layer 150 may be defined as the first portion 122, and another portion of the first graphene layer 120 exposed by the first build-up circuit layer 150 may be defined as the second portion 124. The first portion 122 and the second portion 124 are alternately disposed. Specifically, the first portion 122 may be disposed on the side wall 116S of the first opening 116, the upper surface 112a of the portion of the circuit layer 112 (for example, the pad 1121) exposed by the first opening 116, and the upper surface 114a of a portion of the first dielectric layer 114. The second portion 124 may be disposed on the upper surface 114a of another portion of the first dielectric layer 114.

Please refer to FIG. 1D and FIG. 1E at the same time. Since a reduced graphene material has extremely high electron mobility (greater than 15,000 $cm^2V^{-1}s^{-1}$) and low resistivity ($10^{-8}$ Ω·m), the reduced graphene material has good conductivity. Therefore, in the embodiment, the first graphene layer 120 may be used as the seed layer to form the first conductive via 140 and the first build-up circuit layer 150 on the first portion 122 that is not covered by the patterned photoresist layer 130. In the embodiment, the first conductive via 140 and the first build-up circuit layer 150 may directly contact the first portion 122 of the first graphene layer 120 and do not contact the second portion 124 of the first graphene layer 120. The first conductive via 140 and the first build-up circuit layer 150 may expose the second portion 124 of the first graphene layer 120. In other words, an orthographic projection of the first build-up circuit layer 150 onto the first graphene layer 120 may completely overlap with the first portion 122 of the first graphene layer 120 and does not overlap with the second portion 124 of the first graphene layer 120. Here, the materials of the first conductive via 140 and the first build-up circuit layer 150 may be copper or other conductive materials, but not limited thereto.

Figure 1F:
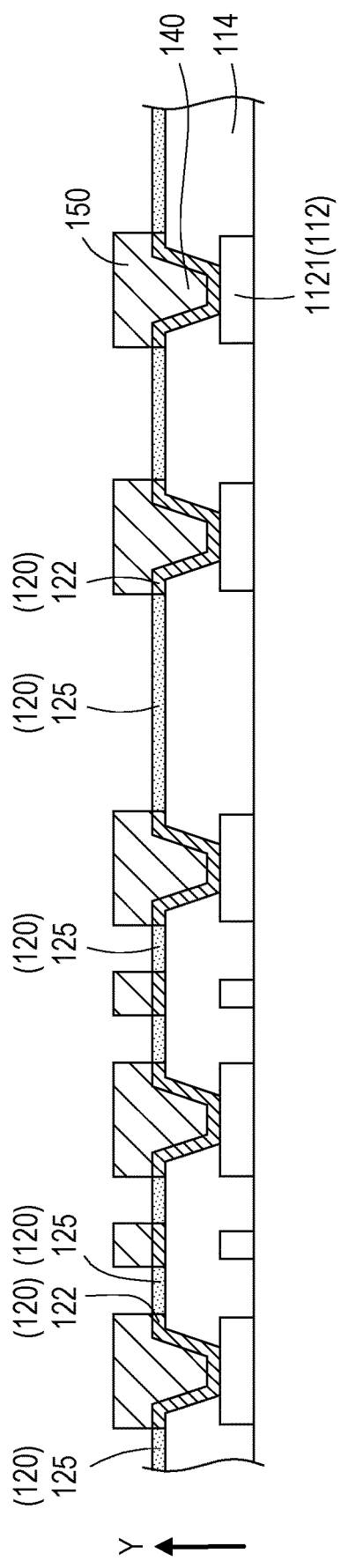

Next, please refer to FIG. 1F. The second portion 124 of the first graphene layer 120 exposed by the first build-up circuit layer 150 is oxidized to form a first non-conductive seed layer region 125, and a section of the first graphene layer 120 that is not oxidized (that is, the first portion 122) is defined as a first conductive seed layer region 122. In the embodiment, the first build-up circuit layer 150 may be disposed corresponding to the first conductive seed layer region 122, and the first build-up circuit layer 150 may be electrically connected to the pads 1121 through the first conductive via 140 and the first conductive seed layer region 122. Specifically, since the first conductive via 140 and the first build-up circuit layer 150 may completely cover the first portion 122 of the first graphene layer 120, in this step, only the second portion 124 of the first graphene layer 120 exposed by the first build-up circuit layer 150 is oxidized to form the first non-conductive seed layer region 125. The first conductive seed layer region 122 and the first non-conductive seed layer region 125 are alternately disposed. The first conductive seed layer region 122 may be the reduced graphene, and the first non-conductive seed layer region 125 may be the oxidized graphene. In a normal direction Y of the circuit board structure 10a, an orthographic projection area of the first build-up circuit layer 150 may be substantially equal to an orthographic projection area of the first conductive seed layer region 122. Here, the method for oxidizing the second portion 124 of the first graphene layer 120 is, for example, a dry process performed with $O_2/O_3$ plasma oxidation or a wet process performed with $KMnO_4/H_2O_2$ aqueous solution (that is, the Hummers' method), but not limited thereto.

In other embodiments (not shown), when the second portion 124 of the first graphene layer 120 is oxidized, the first portion 122 adjacent to the second portion 124 may also be oxidized, so that the first non-conductive seed layer region 125 includes the second portion 124 and a small portion of the first portion 122. At this time, the first build-up circuit layer 150 may contact the first non-conductive seed layer region 125. In other words, in the normal direction Y of the circuit board structure 10a, the orthographic projection of the first build-up circuit layer 150 partially overlaps with the first non-conductive seed layer region 125, but the disclosure is not limited thereto.

In some embodiments, the first build-up circuit layer 150 contacts the first conductive seed layer region 122, and the first build-up circuit layer 150 may partially contact (not shown) or not contact the first non-conductive seed layer region 125 (as shown in FIG. 1F). Since an oxidized graphene material has high resistivity ($10^{12}$ Ω·m), the first non-conductive seed layer region 125 may have good insulation, so that no additional etching process is required to remove the first non-conductive seed layer region 125 after forming the first build-up circuit layer 150. In this way, in addition to preventing the conventional situation of circuit undercut, circuit peel-off, or circuit shape deformation from happening to the seed layer covered by the first build-up circuit layer when removing the seed layer exposed by the first build-up circuit layer, the reliability of signal transmission or the yield of the product can also be effectively improved.

Figure 1G:
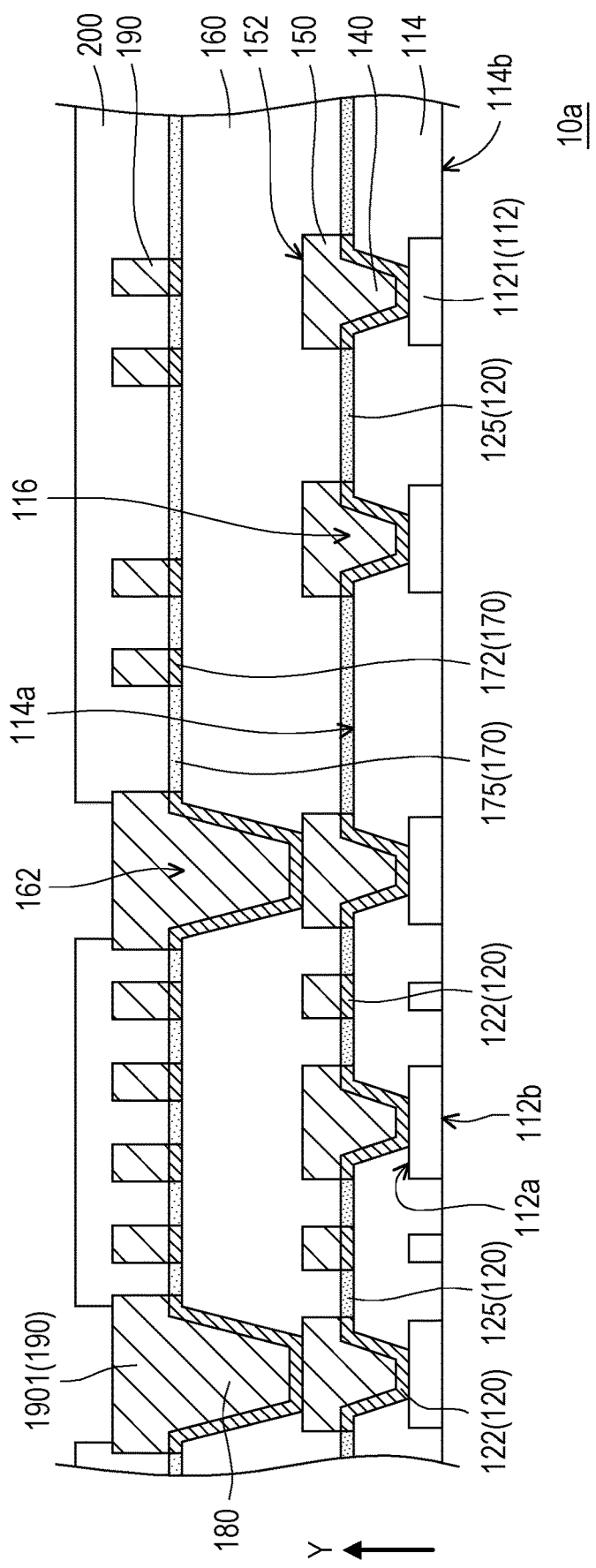

Next, please refer to FIG. 1G. A second dielectric layer 160, a second opening 162, a second graphene layer 170, a second conductive via 180, a second build-up circuit layer 190, and an insulating protective layer 200 are formed. Specifically, the second dielectric layer 160 is first formed on the first build-up circuit layer 150 and covers the first non-conductive seed layer region 125. The first dielectric layer 114 and the second dielectric layer 160 may be respectively located on opposite sides of the first non-conductive seed layer region 125.

Next, similar to the step of FIG. 1B, the second opening 162 is formed in the second dielectric layer 160 to expose the first build-up circuit layer 150. In the embodiment, the second opening 162 exposes a corresponding portion of the first build-up circuit layer 150 away from a portion of an upper surface 152 of the first graphene layer 120, but not limited thereto.

Next, similar to the step of FIG. 1C, the second graphene layer 170 is conformally formed on the second dielectric layer 160 and in the second opening 162.

Next, similar to the steps of FIG. 1D and FIG. 1E, the second conductive via 180 is formed in the second opening 162, and the second build-up circuit layer 190 is formed on a third portion 172 of the second graphene layer 170 to expose a fourth portion (that is, s second non-conductive seed layer region 175 in FIG. 1G) of the second graphene layer 170.

Next, similar to the step of FIG. 1F, the fourth portion of the second graphene layer 170 is oxidized to form the second non-conductive seed layer region 175, and a section of the second graphene layer 170 that is not oxidized (that is, the third portion 172) is defined as a second conductive seed layer region 172. The second build-up circuit layer 190 is disposed corresponding to the second conductive seed layer region 172, and the second build-up circuit layer 190 is electrically connected to the first build-up circuit layer 150 through the second conductive via 180 and the second conductive seed layer region 172.

Specifically, since the second conductive via 180 and the second build-up circuit layer 190 may completely cover the third portion 172 of the second graphene layer 170, in this step, only the fourth portion of the second graphene layer 170 is oxidized to form the second non-conductive seed layer region 175. The second conductive seed layer region 172 and the second non-conductive seed layer region 175 are alternately disposed. The second conductive seed layer region 172 may be the reduced graphene, and the second non-conductive seed layer region 175 may be the oxidized graphene. In the normal direction Y of the circuit board structure 10a, an orthographic projection area of the second build-up circuit layer 190 may be substantially equal to an orthographic projection area of the second conductive seed layer region 172.

In some embodiments, the second build-up circuit layer 190 contacts the second conductive seed layer region 172, and the second build-up circuit layer 190 may partially contact (not shown) or not contact the second non-conductive seed layer region 175 (as shown in FIG. 1G). Since the second non-conductive seed layer region 175 may have good insulation, no additional etching process is required to remove the second non-conductive seed layer region 175 after forming the second build-up circuit layer 190. In this way, in addition to preventing the conventional situation of circuit undercut, circuit peel-off, or circuit shape deformation from happening to the seed layer covered by the second build-up circuit layer when removing the seed layer exposed by the second build-up circuit layer, the reliability of signal transmission or the yield of the product can also be effectively improved.

Then, the insulating protective layer 200 is formed on the second build-up circuit layer 190 to expose a pad 1901 of the second build-up circuit layer 190. So far, the production of the circuit board structure 10a has been completed.

In the embodiment, the oxidized graphene material and the reduced graphene material both have excellent thermal conductivity (the thermal conductivity of the single-layer graphene film may reach 5300 W/mK). Therefore, compared to the conventional measure of performing heat conduction on heat generated by an inner circuit through an embedded heat dissipation copper block, the circuit board structure 10a of the embodiment may perform heat conduction on heat generated by inner circuits (that is, the circuit layer 112, the first conductive via 140, the first build-up circuit layer 150, the second conductive via 180, and the second build-up circuit layer 190) also through the first conductive seed layer region 122, the first non-conductive seed layer region 125, the second conductive seed layer region 172, and the second non-conductive seed layer region 175, so that the circuit board structure 10a of the embodiment can have better heat dissipation efficiency.

In short, the circuit board structure 10a of the embodiment includes the circuit layer 112, the first dielectric layer 114, the first graphene layer 120, the first conductive via 140, and the first build-up circuit layer 150. The circuit layer 112 includes the pads 1121. The first dielectric layer 114 is disposed on the circuit layer 112 and has the first opening 116. The first opening 116 exposes the pads 1121. The first graphene layer 120 is conformally disposed on the first dielectric layer 114 and in the first opening 116, and has the first conductive seed layer region 122 and the first non-conductive seed layer region 125 alternately disposed. The first conductive via 140 is disposed in the first opening 116. The first build-up circuit layer 150 is disposed corresponding to the first conductive seed layer region 122. The first build-up circuit layer 150 exposes the first non-conductive seed layer region 125 and is electrically connected to the pads 1121 through the first conductive via 140 and the first conductive seed layer region 122.

It is particularly noted here that although the circuit board structure 10a of the embodiment only shows three layers of circuit layers (that is, the circuit layer 112, the first build-up circuit layer 150, and the second build-up circuit layer 190), two layers of graphene layers (that is, the first graphene layer 120 and the second graphene layer 170), and the two layers of dielectric layers (that is, the first dielectric layer 114 and the second dielectric layer 160) stacked on one another, the disclosure does not limit the number of graphene layers, circuit layers, and dielectric layers. In other embodiments, the above steps may be repeated to form a circuit board structure with multiple circuit layers stacked.

Other embodiments will be listed below for description. It must be noted here that the following embodiments continue to use the reference numerals and some content of the above embodiment, wherein the same reference numerals are adopted to represent the same or similar elements, and the description of the same technical content is omitted. For the description of the omitted part, reference may be made to the above embodiment and the description will not be repeated in the following embodiments.

Figure 2:
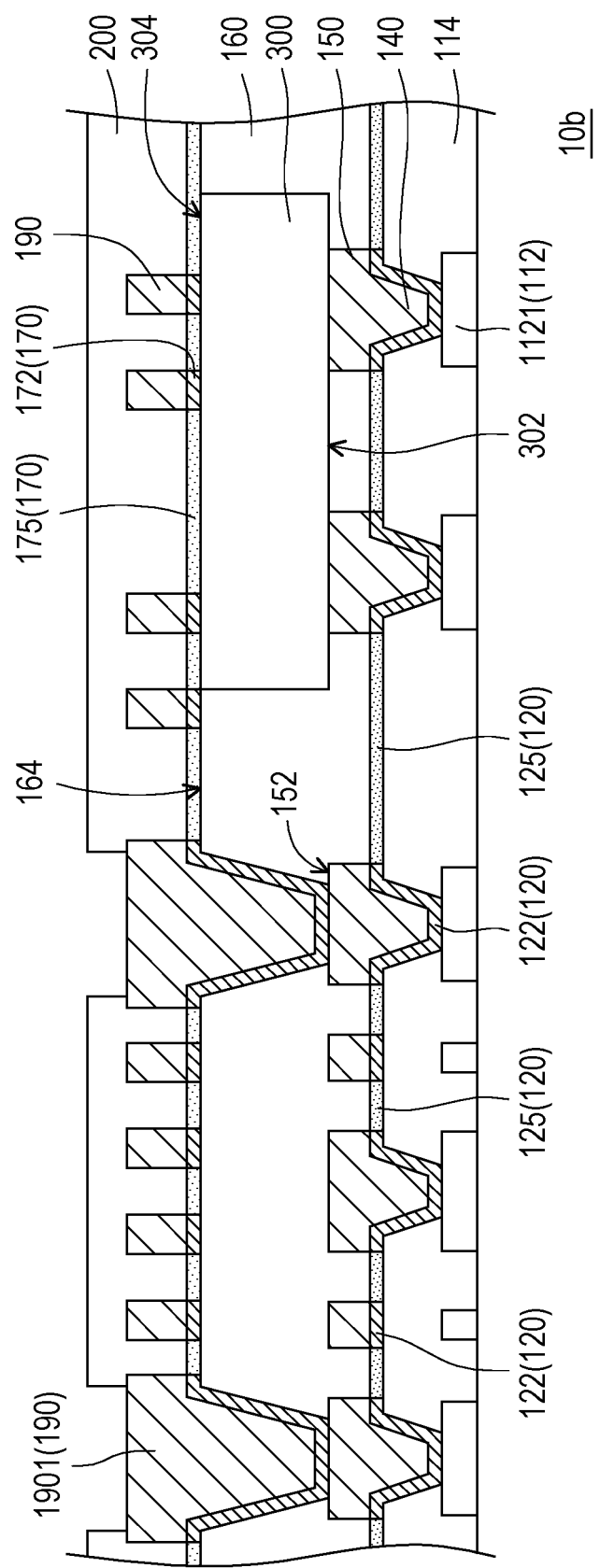
FIG. 2 is a schematic cross-sectional view of a circuit board structure according to an embodiment of the disclosure.

FIG. 2 is a schematic cross-sectional view of a circuit board structure according to an embodiment of the disclosure. Please refer to FIG. 1G and FIG. 2 at the same time. The main difference between a circuit board structure 10b of FIG. 2 and the circuit board structure 10a of FIG. 1G is that the circuit board structure 10b further includes an electronic element 300.

Specifically, please refer to FIG. 2. In the embodiment, the electronic element 300 is embedded in the second dielectric layer 160. The electronic element 300 has an active surface 302 and a back surface 304 opposite to each other. The active surface 302 of the electronic element 300 is electrically connected to the first build-up circuit layer 150, and the back surface 304 contacts the second graphene layer 170. In the embodiment, the electronic element 300 may be, for example, a semiconductor chip (for example, a chip type passive element or a large scale integration (LSI) die), but not limited thereto.

In the embodiment, the method for disposing the electronic element 300 may include the following step. After forming the first non-conductive seed layer region 125 (as shown in FIG. 1F), and before forming the second dielectric layer 160 on the first build-up circuit layer 150 (as shown in FIG. 1G), the electronic element 300 is disposed on the first build-up circuit layer 150.

In the embodiment, since the thickness (that is, a vertical distance between the active surface 302 and the back surface 304) of the electronic element 300 is substantially equal to a vertical distance between an upper surface 164 of the second dielectric layer 160 facing the second build-up circuit layer 190 and the upper surface 152 of the first build-up circuit layer 150, the second dielectric layer 160 may not cover the back surface 304 of the electronic element 300, and the upper surface 164 of the second dielectric layer 160 and the back surface 304 of the electronic element 300 are coplanar. Therefore, the second graphene layer 170 may directly contact the electronic element 300, thereby improving the heat dissipation efficiency of the electronic element 300.

Figure 3:
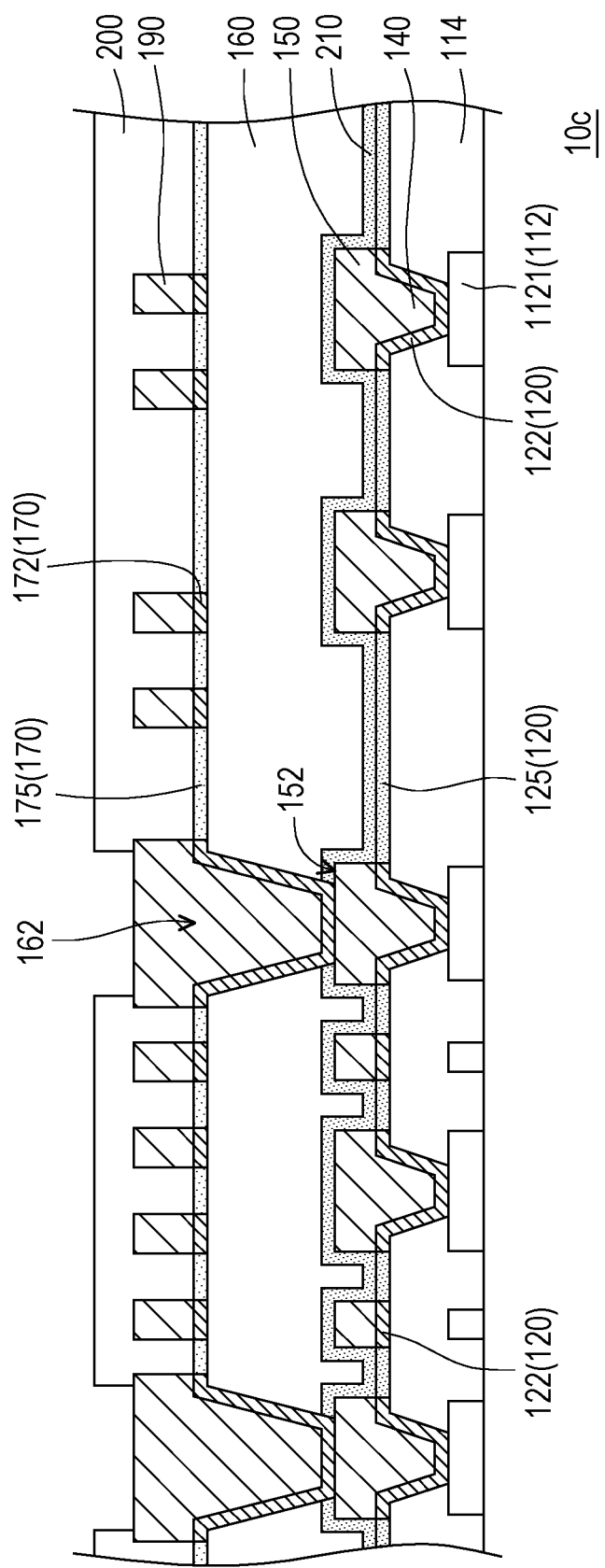
FIG. 3 is a schematic cross-sectional view of a circuit board structure according to another embodiment of the disclosure.

FIG. 3 is a schematic cross-sectional view of a circuit board structure according to another embodiment of the disclosure. Please refer to FIG. 1G and FIG. 3 at the same time. The main difference between a circuit board structure 10c of FIG. 3 and the circuit board structure 10a of FIG. 1G is that the circuit board structure 10b further includes an oxidation graphene layer 210.

Specifically, the oxidation graphene layer 210 may be conformally disposed on the first build-up circuit layer 150 and expose a portion of the upper surface 152 of a portion of the first build-up circuit layer 150 (that is, a portion of the upper surface 152 of the first build-up circuit layer 150 exposed by the second opening 162). The second dielectric layer 160 is disposed on the oxidation graphene layer 210. The first build-up circuit layer 150 and the second dielectric layer 160 are respectively located on opposite sides of the oxidation graphene layer 210. In the embodiment, the oxidation graphene layer 210 may be disposed along contours of the first non-conductive seed layer region 125 and the first build-up circuit layer 150 of the first graphene layer 120, so that the oxidation graphene layer 210 may directly contact the first non-conductive seed layer region 125. The oxidation graphene layer 210 and the first dielectric layer 114 may be respectively located on opposite sides of the first non-conductive seed layer region 125. The second opening 162 may penetrate the second dielectric layer 160 and the oxidation graphene layer 210 to expose a portion of the first build-up circuit layer 150.

In the embodiment, the method for forming the oxidation graphene layer 210 may include the following step. After forming the first non-conductive seed layer region 125 (as shown in FIG. 1F), and before forming the second dielectric layer 160 on the first build-up circuit layer 150 (as shown in FIG. 1G), the oxidation graphene layer 210 is conformally formed on the first build-up circuit layer 150 to cover the first build-up circuit layer 150.

In the embodiment, since the oxidation graphene layer 210 is located on the first build-up circuit layer 150, the surface of the first build-up circuit layer 150 may be flattened, thereby improving the signal transmission efficiency. In addition, since there is a good bonding force between the graphene material (for example, the oxidation graphene layer 210) and the dielectric material (for example, the second dielectric layer 160), the conventional step of coarsening the circuit layer before forming the dielectric material on the circuit layer may be omitted, thereby preventing the signal transmission efficiency from being reduced. Furthermore, since the graphene material has a two-dimensional structure and has the characteristic of accelerating signal transmission, by the design of the oxidation graphene layer 210 and the first graphene layer 120 being respectively located on opposite sides of the first build-up circuit layer 150, the circuit board structure 10c can have better signal transmission efficiency, and the heat dissipation efficiency can also be further improved.

In some other embodiments, the oxidation graphene layer may be disposed on each circuit layer, for example, the oxidation graphene layers are respectively formed on the circuit layer, the first build-up circuit layer, and the second build-up circuit layer. In this way, the circuit board structure can have better heat dissipation efficiency and better signal transmission efficiency.

Figure 4:
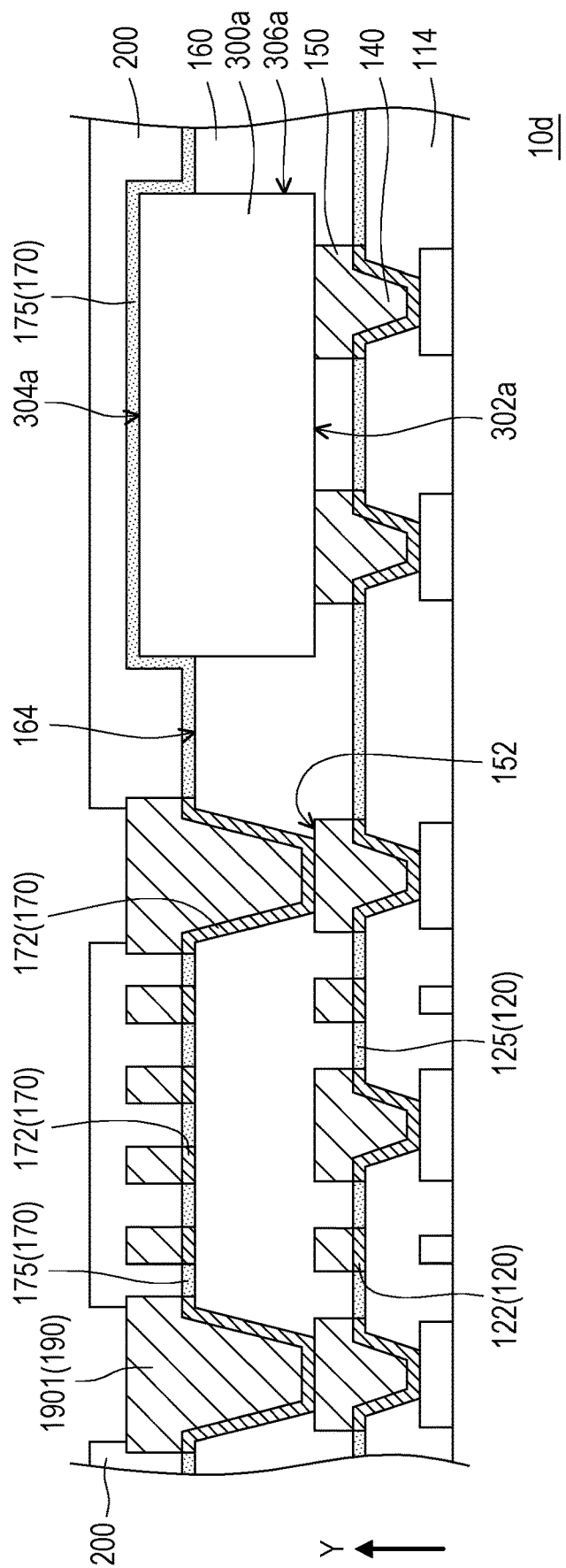
FIG. 4 is a schematic cross-sectional view of a circuit board structure according to another embodiment of the disclosure.

FIG. 4 is a schematic cross-sectional view of a circuit board structure according to another embodiment of the disclosure. Please refer to FIG. 2 and FIG. 4 at the same time. The main difference between a circuit board structure 10d of FIG. 4 and the circuit board structure 10b of FIG. 2 is that an electronic element 300a protrudes from the upper surface 164 of the second dielectric layer 160. The electronic element 300a further has a surrounding surface 306a connecting an active surface 302a and a back surface 304a. The second graphene layer 170 contacts a portion of the surrounding surface 306a.

Specifically, the thickness (that is, a vertical distance between the active surface 302a and the back surface 304a) of the electronic element 300a in the embodiment is greater than a vertical distance between the upper surface 164 of the second dielectric layer 160 and the upper surface 152 of the first build-up circuit layer 150, so that the electronic element 300a may protrude from the upper surface 164 of the second dielectric layer 160. Therefore, after forming the second graphene layer 170 on the second dielectric layer 160, the second graphene layer 170 may contact the back surface 304a of the electronic element 300a and a portion of the surrounding surface 306a, thereby improving the heat dissipation efficiency. In addition, in the normal direction Y of the circuit board structure 10d, the second build-up circuit layer 190 does not overlap with the electronic element 300a, but not limited thereto.

Figure 5:
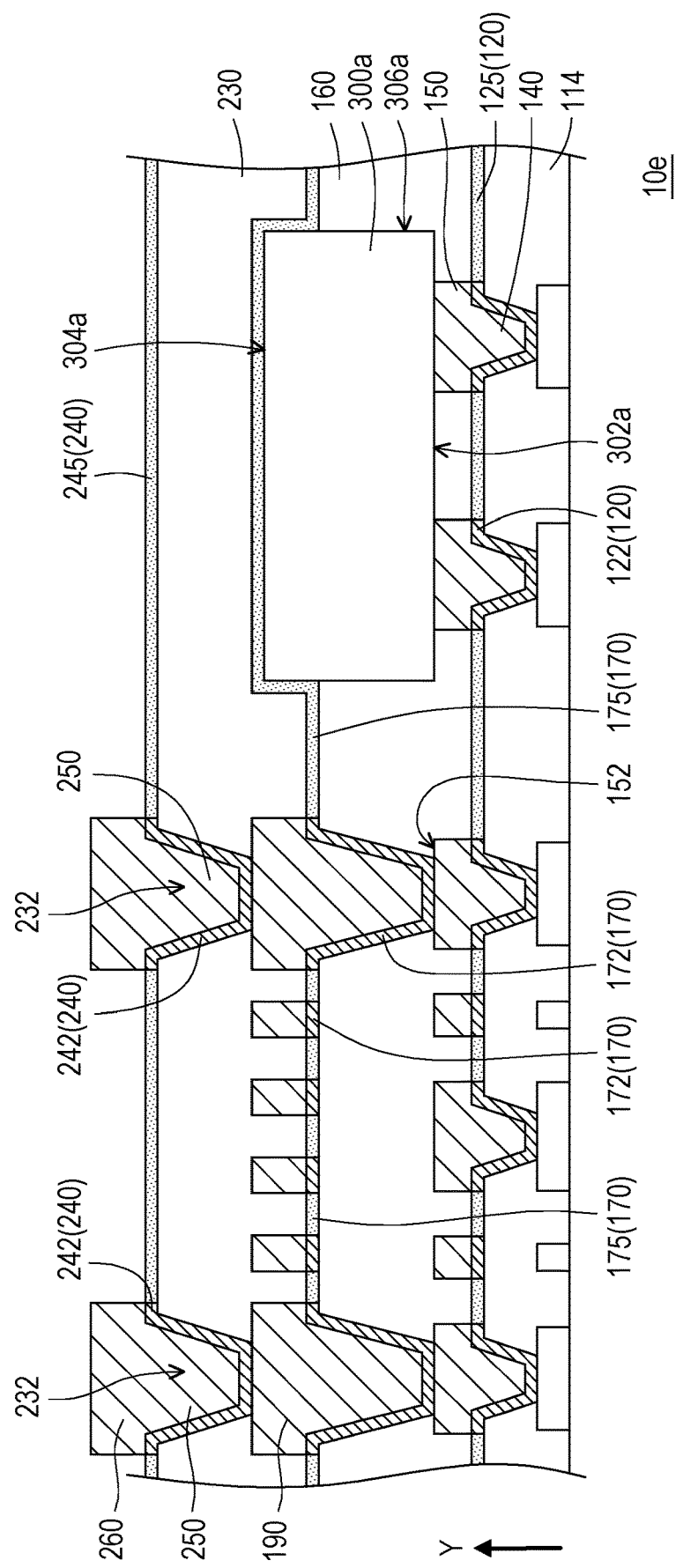
FIG. 5 is a schematic cross-sectional view of a circuit board structure according to another embodiment of the disclosure.

FIG. 5 is a schematic cross-sectional view of a circuit board structure according to another embodiment of the disclosure. Please refer to FIG. 4 and FIG. 5 at the same time. The main difference between a circuit board structure 10e of FIG. 5 and the circuit board structure 10d of FIG. 4 is that the circuit board structure 10e further includes a third dielectric layer 230, a third graphene layer 240, a third conductive via 250, and a third build-up circuit layer 260.

Specifically, the third dielectric layer 230 is disposed on the second build-up circuit layer 190 and covers the second non-conductive seed layer region 175. The third dielectric layer 230 has a third opening 232, and the third opening 232 exposes the second build-up circuit layer 190. The third graphene layer 240 is conformally disposed on the third dielectric layer 230 and in the third opening 232, and has a third conductive seed layer region 242 and a third non-conductive seed layer region 245. The third conductive via 250 is disposed in the third opening 232. The third build-up circuit layer 260 is disposed corresponding to the third conductive seed layer region 242. The third build-up circuit layer 260 exposes the third non-conductive seed layer region 245, and the third build-up circuit layer 260 is electrically connected to the second build-up circuit layer 190 through the third conductive via 250 and the third conductive seed layer region 242.

In some embodiments, the third build-up circuit layer 260 contacts the third conductive seed layer region 242 and may partially contact (not shown) or not contact the third non-conductive seed layer region 245 (as shown in FIG. 5). In addition, in the normal direction Y of the circuit board structure 10e, an orthographic projection area of the third build-up circuit layer 260 is substantially equal to an orthographic projection area of the third conductive seed layer region 242.

Figure 6:
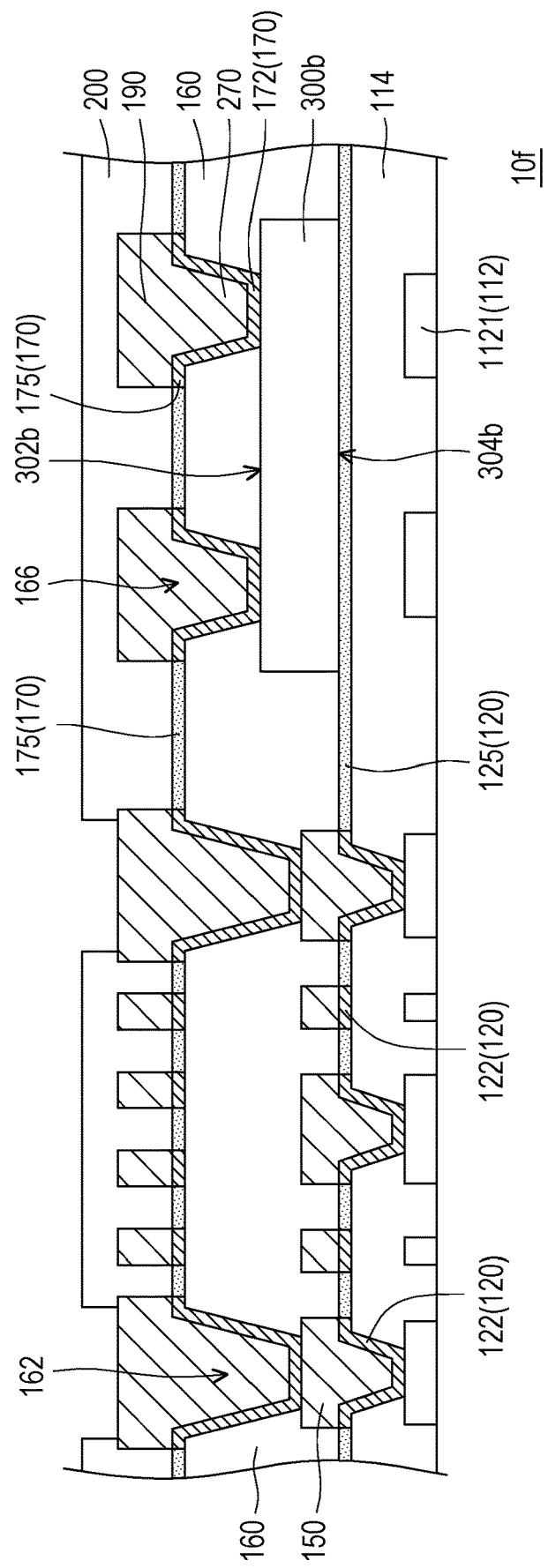
FIG. 6 is a schematic cross-sectional view of a circuit board structure according to another embodiment of the disclosure.

FIG. 6 is a schematic cross-sectional view of a circuit board structure according to another embodiment of the disclosure. Please refer to FIG. 1G and FIG. 6 at the same time. The main difference between a circuit board structure 10f of FIG. 6 and the circuit board structure 10a of FIG. 1G is that the second dielectric layer 160 further has a fourth opening 166, and the circuit board structure 10e further includes an electronic element 300b and a fourth conductive via 270.

Specifically, the electronic element 300b is disposed on the first non-conductive seed layer region 125 and has an active surface 302b and a back surface 304b opposite to each other. The fourth conductive via 270 is disposed in the fourth opening 166. The second build-up circuit layer 190 is electrically connected to the electronic element 300b through the fourth conductive via 270 and the second conductive seed layer region 172.

In the embodiment, the method for disposing the electronic element 300b may include the following step. After forming the first non-conductive seed layer region 125 (as shown in FIG. 1F), and before forming the second dielectric layer 160 on the first build-up circuit layer 150 (as shown in FIG. 1G), the electronic element 300b is disposed on the first non-conductive seed layer region 125. The electronic element 300b does not contact the first build-up circuit layer 150. In addition, after forming the second dielectric layer 160 on the first build-up circuit layer 150, the method further includes the following step. The fourth conductive via 270 is formed in the fourth opening 166, so that the second build-up circuit layer 190 is electrically connected to the electronic element 300b through the fourth conductive via 270 and the second conductive seed layer region 172.

Figure 7:
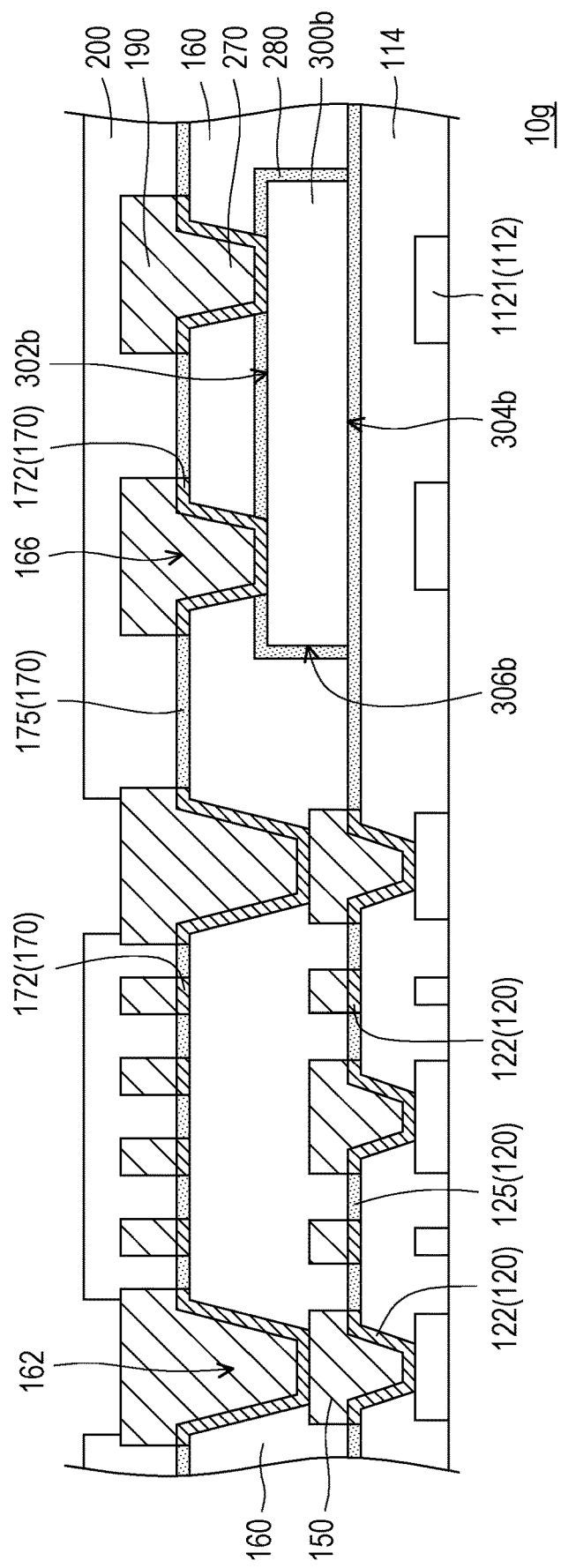
FIG. 7 is a schematic cross-sectional view of a circuit board structure according to another embodiment of the disclosure.

FIG. 7 is a schematic cross-sectional view of a circuit board structure according to another embodiment of the disclosure. Please refer to FIG. 6 and FIG. 7 at the same time. The main difference between a circuit board structure 10g of FIG. 7 and the circuit board structure 10f of FIG. 6 is that the circuit board structure 10g further includes an oxidation graphene layer 280. The oxidation graphene layer 280 is disposed between the electronic element 300b and the second dielectric layer 160.

Specifically, the electronic element 300b further has a surrounding surface 306b connecting the active surface 302b and the back surface 304b. The oxidation graphene layer 280 is conformally disposed on a portion of the active surface 302b and the surrounding surface 306b of the electronic element 300b. The fourth opening 166 may penetrate the second dielectric layer 160 and the oxidation graphene layer 280 to expose a portion of the active surface 302a.

In the embodiment, the method for forming the oxidation graphene layer 280 may include the following steps. After forming the first non-conductive seed layer region 125 (as shown in FIG. 1F), and before forming the second dielectric layer 160 on the first build-up circuit layer 150 (as shown in FIG. 1G), the electronic element 300b is first disposed on the first non-conductive seed layer region 125. Then, the oxidation graphene layer 280 is conformally formed on the electronic element 300b to cover the active surface 302b and the surrounding surface 306b.

In the embodiment, since the oxidation graphene layer 280 directly contacts a portion of the active surface 302b and the surrounding surface 306b of the electronic element 300b, the heat dissipation efficiency of the electronic element 300b can be further improved.

In summary, in the circuit board structure of the embodiments of the disclosure, since the first non-conductive seed layer region may have good insulation, no additional etching process is required to remove the first non-conductive seed layer region after forming the first build-up circuit layer. In this way, the conventional situation of circuit undercut, circuit peel-off, or circuit shape deformation can be prevented from happening to the seed layer covered by the first build-up circuit layer when removing the seed layer exposed by the first build-up circuit layer, and the reliability of signal transmission or the yield of the product can also be effectively improved. In addition, the oxidized graphene material and the reduced graphene material both have excellent thermal conductivity. Therefore, compared to the conventional measure of performing heat conduction on heat generated by an inner circuit through an embedded heat dissipation copper block, the circuit board structure of the embodiments may perform heat conduction on heat generated by inner circuits also through the first conductive seed layer region, the first non-conductive seed layer region, the second conductive seed layer region, and/or the second non-conductive seed layer region, so that the circuit board structure of the embodiments can have better heat dissipation efficiency.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A circuit board structure, comprising:
a circuit layer, comprising a plurality of pads;
a first dielectric layer, disposed on the circuit layer and having a first opening, wherein the first opening exposes the plurality of pads;
a first graphene layer, conformally disposed on the first dielectric layer and in the first opening, and having a first conductive seed layer region and a first non-conductive seed layer region;
a first conductive via, disposed in the first opening;
a first build-up circuit layer, disposed corresponding to the first conductive seed layer region, wherein the first build-up circuit layer exposes the first non-conductive seed layer region and is electrically connected to the plurality of pads through the first conductive via and the first conductive seed layer region;
a second dielectric layer, disposed on the first build-up circuit layer and covering the first non-conductive seed layer region, wherein the second dielectric layer has a second opening, and the second opening exposes the first build-up circuit layer;
a second graphene layer, conformally disposed on the second dielectric layer and in the second opening, and having a second conductive seed layer region and a second non-conductive seed layer region;
a second conductive via, disposed in the second opening; and
a second build-up circuit layer, disposed corresponding to the second conductive seed layer region, wherein the second build-up circuit layer exposes the second non-conductive seed layer region and is electrically connected to the first build-up circuit layer through the second conductive via and the second conductive seed layer region.

2. The circuit board structure according to claim 1, further comprising:
an oxidation graphene layer, conformally disposed on the first build-up circuit layer, wherein the second opening penetrates the oxidation graphene layer to expose a portion of a surface of the first build-up circuit layer.

3. The circuit board structure according to claim 1, further comprising:
an insulating protective layer, disposed on the second build-up circuit layer and exposing a pad of the second build-up circuit layer.

4. The circuit board structure according to claim 1, further comprising:
an electronic element, embedded in the second dielectric layer and having an active surface and a back surface opposite to each other, wherein the active surface of the electronic element is electrically connected to the first build-up circuit layer, and the back surface contacts the second graphene layer.

5. The circuit board structure according to claim 4, wherein the electronic element protrudes from an upper surface of the second dielectric layer, the electronic element further has a surrounding surface connecting the active surface and the back surface, and the second graphene layer contacts a portion of the surrounding surface.

6. The circuit board structure according to claim 5, further comprising:
a third dielectric layer, disposed on the second build-up circuit layer and covering the second non-conductive seed layer region, wherein the third dielectric layer has a third opening, and the third opening exposes the second build-up circuit layer;
a third graphene layer, conformally disposed on the third dielectric layer and in the third opening, and having a third conductive seed layer region and a third non-conductive seed layer region;
a third conductive via, disposed in the third opening; and
a third build-up circuit layer, disposed corresponding to the third conductive seed layer region, wherein the third build-up circuit layer exposes the third non-conductive seed layer region and is electrically connected to the second build-up circuit layer through the third conductive via and the third conductive seed layer region.

7. The circuit board structure according to claim 1, wherein the second dielectric layer further has a fourth opening, the circuit board structure further comprising:
an electronic element, disposed on the first non-conductive seed layer region and having an active surface and a back surface opposite to each other; and
a fourth conductive via, disposed in the fourth opening, wherein the second build-up circuit layer is electrically connected to the electronic element through the fourth conductive via and the second conductive seed layer region.

8. The circuit board structure according to claim 7, further comprising:
an oxidation graphene layer, conformally disposed on the electronic element and located between the electronic element and the second dielectric layer.

9. A manufacturing method of a circuit board structure, comprising:
providing a circuit structure, wherein the circuit structure comprises a circuit layer and a first dielectric layer, the first dielectric layer is disposed on the circuit layer, and the circuit layer comprises a plurality of pads;
forming a first opening in the first dielectric layer to expose the plurality of pads;

conformally forming a first graphene layer on the first dielectric layer and in the first opening, wherein the first graphene layer has a first portion and a second portion;

forming a first conductive via in the first opening;

forming a first build-up circuit layer on the first portion to expose the second portion;

oxidizing the second portion of the first graphene layer to form a first non-conductive seed layer region, and defining the first portion as a first conductive seed layer region, wherein the first build-up circuit layer is disposed corresponding to the first conductive seed layer region and is electrically connected to the plurality of pads through the first conductive via and the first conductive seed layer region;

forming a second dielectric layer on the first build-up circuit layer to cover the first non-conductive seed layer region, wherein the second dielectric layer has a second opening to expose the first build-up circuit layer;

conformally forming a second graphene layer on the second dielectric layer and in the second opening, wherein the second graphene layer has a third portion and a fourth portion;

forming a second conductive via in the second opening;

forming a second build-up circuit layer on the third portion to expose the fourth portion; and oxidizing the fourth portion of the second graphene layer to form a second non-conductive seed layer region, and defining the third portion as a second conductive seed layer region, wherein the second build-up circuit layer is disposed corresponding to the second conductive seed layer region and is electrically connected to the first build-up circuit layer through the second conductive via and the second conductive seed layer region.

10. The manufacturing method according to claim 9, further comprising:

forming an insulating protective layer on the second build-up circuit layer to expose a pad of the second build-up circuit layer.

11. The manufacturing method according to claim 9, wherein before forming the second dielectric layer on the first build-up circuit layer, the manufacturing method further comprises:

disposing an electronic element on the first build-up circuit layer, wherein the electronic element has an active surface and a back surface opposite to each other, the active surface is electrically connected to the first build-up circuit layer, and the back surface faces the second graphene layer.

12. The manufacturing method according to claim 9, wherein the second dielectric layer further has a fourth opening, and before forming the second dielectric layer on the first build-up circuit layer, the manufacturing method further comprises:

disposing an electronic element on the first non-conductive seed layer region, wherein the electronic element has an active surface and a back surface opposite to each other and a surrounding surface connecting the active surface and the back surface, and the back surface faces the first non-conductive seed layer region; and conformally forming an oxidation graphene layer on the electronic element to cover the active surface and the surrounding surface, wherein after forming the second dielectric layer on the first build-up circuit layer, the manufacturing method further comprises:

forming a fourth conductive via in the fourth opening, so that the second build-up circuit layer is electrically connected to the electronic element through the fourth conductive via and the second conductive seed layer region.

13. The manufacturing method according to claim 9, wherein before forming the second dielectric layer on the first build-up circuit layer, the manufacturing method further comprises:

conformally forming an oxidation graphene layer on the first build-up circuit layer to cover the first build-up circuit layer.

\* \* \* \* \*